(12) United States Patent
Wang et al.

(10) Patent No.: US 10,770,167 B1
(45) Date of Patent: Sep. 8, 2020

(54) MEMORY STORAGE APPARATUS AND FORMING METHOD OF RESISTIVE MEMORY DEVICE THEREOF

(71) Applicant: Winbond Electronics Corp., Taichung (TW)

(72) Inventors: Ping-Kun Wang, Taichung (TW); Ming-Che Lin, Taichung (TW); Chien-Min Wu, Taichung (TW); He-Hsuan Chao, Taichung (TW); Chih-Cheng Fu, Taichung (TW); Shao-Ching Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 84 days.

(21) Appl. No.: 16/281,063

(22) Filed: Feb. 20, 2019

(51) Int. Cl.
*G11C 13/00* (2006.01)
*G11C 29/50* (2006.01)
*G11C 29/02* (2006.01)
*G11C 29/24* (2006.01)

(52) U.S. Cl.
CPC ...... *G11C 29/50016* (2013.01); *G11C 13/004* (2013.01); *G11C 13/0035* (2013.01); *G11C 13/0038* (2013.01); *G11C 29/021* (2013.01); *G11C 29/24* (2013.01); *G11C 2013/0045* (2013.01); *G11C 2029/5004* (2013.01); *G11C 2029/5006* (2013.01)

(58) Field of Classification Search
CPC .................................................. G11C 13/0038
See application file for complete search history.

(56) References Cited

U.S. PATENT DOCUMENTS

| | | | |
|---|---|---|---|
| 7,512,507 B2 | 3/2009 | Gatzemeier et al. | |
| 8,830,728 B2 | 9/2014 | Lee et al. | |
| 2008/0144356 A1* | 6/2008 | Oh | G11C 13/0007 365/148 |
| 2013/0058154 A1* | 3/2013 | Katagiri | G11C 29/24 365/148 |

* cited by examiner

*Primary Examiner* — Douglas King
(74) *Attorney, Agent, or Firm* — JCIPRNET

(57) ABSTRACT

A memory storage apparatus and a forming method of a resistive memory device thereof are provided. A test forming voltage is applied to a redundant resistive memory device and a corresponding test current is read. A forming voltage applied to a main memory cell block is determined according to the test forming voltage, the test current, a forming current-voltage characteristic data and a target forming current.

13 Claims, 2 Drawing Sheets

MEMORY STORAGE APPARATUS AND FORMING METHOD OF RESISTIVE MEMORY DEVICE THEREOF

BACKGROUND OF THE DISCLOSURE

1. Field of the Disclosure

The disclosure relates to a memory apparatus, and more particularly, relates to a resistive memory storage apparatus and a forming method of a resistive memory device thereof.

2. Description of Related Art

In recent years, resistive memories (e.g., a resistive random access memory (RRAM)) have been rapidly developed to become one of most watched future memory structures. With advantages like low power consumption, high speed operation, high density and potential of being compatible with the manufacturing process of complementary metal-oxide-semiconductor (CMOS), the resistive memories are well suited as the next generation non-volatile memory device. High temperature data retention (HTDR) of a resistive memory device has a decisive influence to reliability testing and commercialization. In the prior art, in order to improve high temperature data retention, manufacturing process adjustments, algorithm corrections or electrical parameter adjustments are often used to achieve such a goal, and yet there is still considerable room for improvement.

The RRAM is a nonvolatile memory, in which each RRAM unit includes an upper electrode plate, a lower electrode plate, a dielectric material layer sandwiched between the upper and lower electrode plates. The dielectric material layer is typically insulated, and a conductive path passing through the dielectric material layer (which is usually called a conductive filament (CF)) can be formed in the dielectric material layer by performing a forming operation on memory cells through a suitable voltage applied to the upper electrode plate.

After the conductive filament is formed, a reset operation may be performed through an appropriate voltage applied to the upper electrode plate to cut off the conductive filament and cause a high resistance state (HRS) on the RRAM unit. Then, a set operation may be performed on the RRAM unit through the suitable voltage applied on the upper electrode plate again to re-form the conductive filament and cause a low resistance state (LRS) on the RRAM unit. By repeatedly performing the set operation and the reset operation, a resistance state (LRS or HRS) of the RRAM may be controlled. LRS and HRS may be used to indicate a digital signal of "0" or "1" to provide relevant memory functions.

In the prior art, due to rapid changes in the manufacturing process and the materials used in the RRAM, how to find proper operating conditions quickly and effectively has become a very important issue in the RRAM development process. If poor operating conditions are used, it is likely to cause factors related to the material misjudgment during the test, which will affect the development schedule and performance of the RRAM. Since the forming operation is a critical step in determining the conductive filament pattern, finding a proper voltage range for the forming operation will facilitate the formation of a preferred conductive filament, thereby providing a good conductive path.

SUMMARY OF THE DISCLOSURE

The disclosure provides a memory storage apparatus and a forming method of a resistive memory device thereof, which are capable of optimizing a conductive filament forming voltage for each die so as to obtain the optimized high temperature data retention (HTDR).

A memory storage apparatus of the disclosure includes a memory cell array and a memory control circuit. The memory cell array includes a main memory cell block and a redundant memory cell block. The main memory cell block includes a plurality of resistive memory devices arranged in an array. The redundant memory cell block includes a plurality of redundant resistive memory devices arranged in an array. The memory control circuit is coupled to the memory cell array, applies a test forming voltage to at least one redundant resistive memory device, reads a corresponding test current, and determines a forming voltage applied to the main memory cell block according to the test forming voltage, the test current, a forming current-voltage characteristic data and a target forming current.

In an embodiment of the disclosure, the memory control circuit includes a forming control circuit, a forming voltage generator and a forming current sense circuit. The forming voltage generator is coupled to the forming control circuit and the memory array, and controlled by the forming control circuit to generate the test forming voltage and the forming voltage. The forming current sense circuit is coupled to the forming control circuit and the memory array, and reads the test current to generate a test current signal to the forming control circuit. The forming control circuit determines the forming voltage according to the test forming voltage, the test current signal, the forming current-voltage characteristic data and the test forming voltage, and controls the forming voltage generator to apply the forming voltage to the main memory cell block.

The disclosure further provides a forming method of a resistive memory device of a memory storage apparatus. The memory storage apparatus includes a memory array. The memory cell array includes a main memory cell block and a redundant memory cell block. The forming method of the resistive memory device includes the following steps. A test forming voltage is applied to at least one redundant resistive memory device and a corresponding test current is read. A forming voltage applied to a main memory cell block is determined according to the test forming voltage, the test current, a forming current-voltage characteristic data and a target forming current. The forming voltage is applied to the main memory cell block.

Based on the above, according to the embodiments of the disclosure, the test forming voltage is applied to the at least one redundant resistive memory device, and the corresponding test current is read. Then, the forming voltage applied to the main memory cell block is determined according to the test forming voltage, the test current, the forming current-voltage characteristic data and the target forming current. In this way, the forming voltage used for forming the conductive filament may be optimized for each die to obtain the optimized high temperature data retention.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
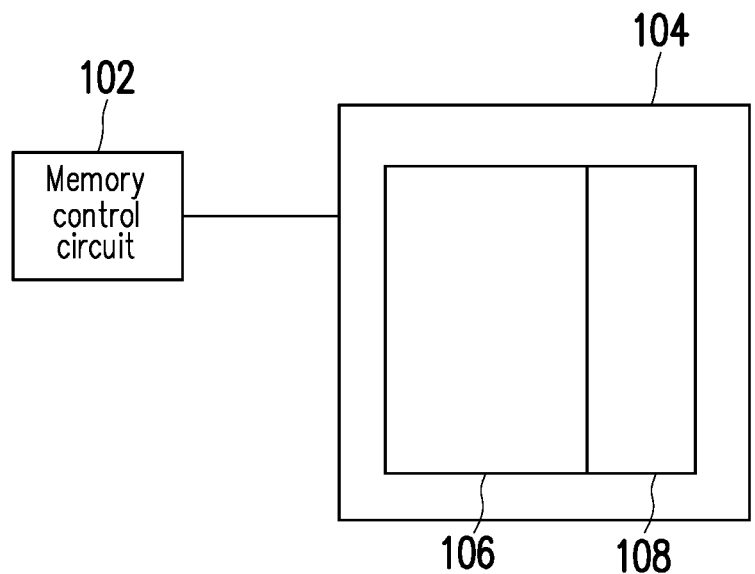
FIG. 1 is a schematic diagram of a memory storage apparatus according to an embodiment of the disclosure.

Reference will now be made in detail to the preferred embodiments of the disclosure, examples of which are illustrated in the accompanying drawings. Wherever possible, the same reference numbers are used in the drawings and the description to refer to the same or like parts.

Embodiments are provided below to describe the disclosure in detail, though the disclosure is not limited to the provided embodiments, and the provided embodiments can be suitably combined. The term "coupling/coupled" used in this specification (including claims) of the application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

FIG. 1 illustrates a schematic diagram of a memory storage apparatus according to an embodiment of the disclosure. The memory storage apparatus of the embodiment includes a memory control circuit 102 and a memory cell array 104. The memory cell array 104 is coupled to the memory control circuit 102. The memory cell array 104 includes a main memory cell block 106 and a redundant memory cell block 108. The memory storage apparatus may be, for example, a resistive random access memory (RRAM) apparatus. Here, the main memory cell block 106 includes a plurality of resistive memory devices arranged in an array (not illustrated), and the redundant memory cell block 108 includes a plurality of redundant resistive memory devices arranged in an array (not illustrated).

The memory control circuit 102 can perform a forming procedure on the resistive memory devices in the main memory cell block 106 and the redundant memory cell block 108. The forming procedure refers to a process for initializing the resistive memory devices. In this process, a bias voltage is constantly applied to electrodes at both sides of the resistive memory device to generate an applied electric field on a dielectric layer. When the applied electric field exceeds a threshold, a dielectric breakdown will occur on the dielectric layer to form a conductive filament, thereby transitioning from a high resistance state (HRS) to a low resistance state (LRS). Such breakdown is not permanent, and a resistance of the dielectric layer can still be changed according to a subsequently applied voltage.

Specifically, during the forming procedure, the memory control circuit 102 of the embodiment can apply a test forming voltage to the redundant resistive memory devices in the redundant memory cell block 108 first, read a corresponding test current from bit lines, and determine a forming voltage applied to resistive memory devices in the main memory cell block 106 according to the test forming voltage, the test current, a forming current-voltage characteristic data and a target forming current. In detail, the memory control circuit 102 of the embodiment can include the forming current-voltage characteristic data that is set according to the target forming current to be reached by the main memory cell block 106, and configured to indicate a relationship between the test forming voltage, the test current and the forming voltage. Herein, the forming current-voltage characteristic data may include, for example, a forming current-voltage characteristic curve or a forming current-voltage characteristic look-up table. Although the forming current-voltage characteristic curve, the forming current-voltage characteristic look-up table and the target forming current may vary depending on the manufacturing process or circuit design method of the memory storage apparatus, the memory storage apparatuses with the same manufacturing process or circuit design method have similar characteristics.

In certain embodiments, the forming current-voltage characteristic curve may be used to determine the forming voltage. For instance, the forming current-voltage characteristic curve may be, for example, a straight line having a preset slope. In this embodiment, the preset slope may be, for example, 17, while the target forming current optimized for forming the conductive filament may be, for example, 31 µA, but not limited thereto. After the memory control circuit 102 applies the test forming voltage of 1.9V to the redundant resistive memory devices in the redundant memory cell block 108, if the read test current is 25 µA, the forming voltage applied to the main memory cell block 106 will be equal to 1.9+(31−25)/17=2.253V. By analogy, if the read test current is 27 µA, the forming voltage applied to the main memory cell block 106 will be equal to 1.9+(31−27)/17=2.135V. Here, the test forming voltage and the forming voltage may include a gate voltage and a drain voltage. Although the embodiment is described with calculation of the gate voltage as an example, the drain voltage may also be used in the same way for such optimization so details regarding the same are not repeated hereinafter.

In other embodiments, the forming voltage may also be determined by checking a look-up table. For instance, Table 1 is an embodiment of the forming current-voltage characteristic look-up table which indicates, according to the test forming voltage applied to the redundant resistive memory devices and the read test current, the required forming voltage to be applied when the main memory cell block 106 needs to reach the target forming current.

TABLE 1

| Test forming voltage | Test current | Forming voltage |
|---|---|---|
| 1.9 V | 31 µA | 1.90 V |
|  | 30 µA | 1.96 V |
|  | 29 µA | 2.02 V |
|  | 28 µA | 2.08 V |
|  | 27 µA | 2.14 V |
|  | 26 µA | 2.19 V |
|  | 25 µA | 2.25 V |
|  | 24 µA | 2.31 V |
|  | 23 µA | 2.37 V |
|  | 22 µA | 2.43 V |
|  | 21 µA | 2.49 V |

As shown by Table 1, the memory control circuit 102 can first apply the fixed test forming voltage to the redundant resistive memory devices, and then determine the forming voltage of the main memory cell block 106 according to the test current read from the redundant resistive memory devices. In this way, the forming voltage may be obtained without calculating the forming voltage according to the forming current-voltage characteristic curve as described in the foregoing embodiment so computing resources can be saved. For example, when the test current is 24 µA, it can be known that the corresponding forming voltage is 2.31 V simply by checking the look-up table.

In certain embodiments, to ensure the accuracy of the test current, the memory control circuit 102 calculates the test current for estimating the forming voltage according to values of the test current read from a plurality of redundant resistive memory devices. For example, a median current value of the plurality of redundant resistive memory devices may be used as the test current for estimating the forming voltage. Alternatively, a test current average of the plurality of redundant resistive memory devices may be used as the test current for estimating the forming voltage.

As described above, the memory storage apparatus of the embodiment can estimate a voltage value of the forming voltage applied to the main memory cell block 106 by performing the forming procedure on the redundant memory cell block 108. Accordingly, the formation of the conductive wire may be optimized to improve high temperature data retention of the memory storage apparatus and reliability of the memory storage apparatus. In addition, by using the forming procedure for the conductive filament in this embodiment, the forming voltage used to form the conductive filament may be optimized for each die. In this way, problems regarding defects on the conductive filament caused by die-to-die variation or wafer-to-wafer variation may be solved.

It should be noted that, in certain embodiments, after applying the forming voltage to the main memory cell block 106, the memory control circuit 102 can determine whether or not the corresponding forming current reaches the target forming current. If the target forming current is not reached yet, the memory control circuit 102 can apply the forming voltage to the main memory cell block 106 until the forming current reaches the target forming current.

Figure 2:
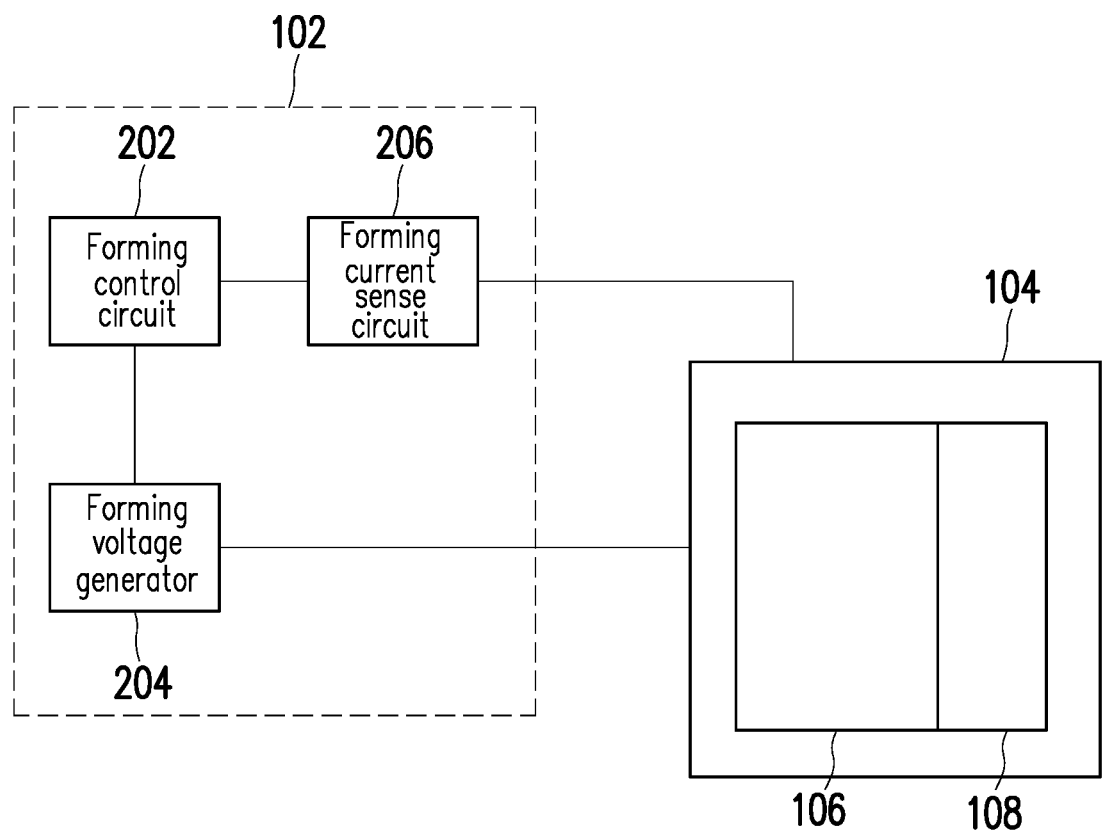
FIG. 2 is a schematic diagram of a memory storage apparatus according to another embodiment of the disclosure.

FIG. 2 is a schematic diagram of a memory storage apparatus according to another embodiment of the disclosure. Specifically, the memory control circuit 102 in the embodiment of FIG. 1 can include a forming control circuit 202, a forming voltage generator 204 and a forming current sense circuit 206. The forming voltage generator 204 is coupled to the forming control circuit 202 and the memory cell array 104. The forming current sense circuit 206 is coupled to the forming control circuit 202 and the memory cell array 104. Here, the forming control circuit 202 can control the forming voltage generator 204 to generate aforesaid test forming voltage to the redundant memory cell block in the memory cell array 104. The forming current sense circuit 206 can read the test current corresponding to the test forming voltage to generate a test current signal, and transmit the test current signal to the forming control circuit 202. The forming control circuit 202 can determine the forming voltage according to the test forming voltage, the test current signal, the forming current-voltage characteristic data and the target forming current, and control the forming voltage generator to apply the forming voltage to the main memory cell block 106. Herein, detailed implementation for determining the forming voltage by the forming control circuit 202 is the same as that in the foregoing embodiment, which is not repeated hereinafter.

Figure 3:
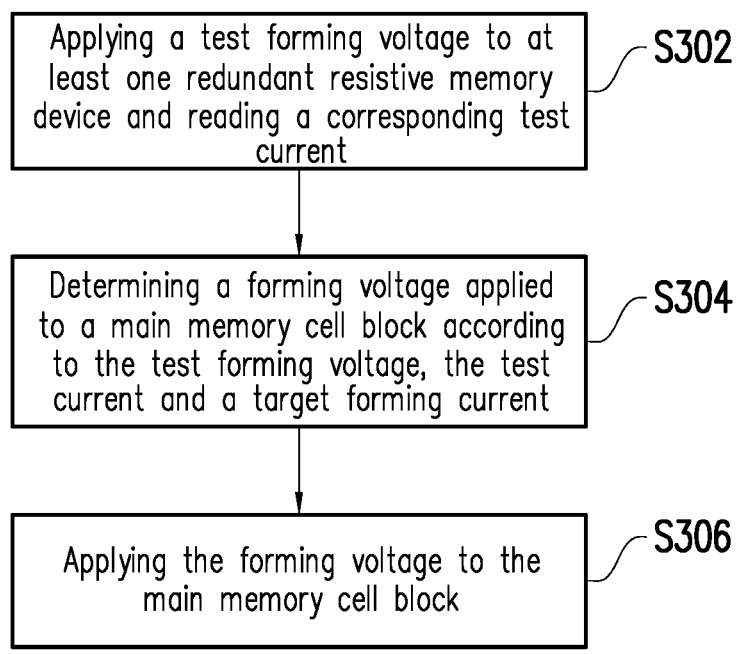
FIG. 3 is a flowchart of a forming method of a resistive memory device of a memory storage apparatus according to an embodiment of the disclosure.

FIG. 3 is a flowchart of a forming method of a resistive memory device of a memory storage apparatus according to an embodiment of the disclosure. As can be known from the foregoing embodiments, the forming method of the resistive memory device of the memory storage apparatus may at least include the following steps. First of all, a test forming voltage is applied to at least one redundant resistive memory device, and a corresponding test current is read (step S302). Here, the test forming voltage includes a gate voltage and a drain voltage. Next, a forming voltage applied to a main memory cell block is determined according to the test forming voltage, the test current, a forming current-voltage characteristic data and a target forming current (step S304). Here, the forming current-voltage characteristic data may include, for example, a forming current-voltage characteristic curve or a forming current-voltage characteristic look-up table. The forming current-voltage characteristic curve may be, for example, a straight line having a preset slope. The forming current-voltage characteristic look-up table may indicate the forming voltage corresponding to the test forming voltage and the test current for reaching the target forming current. In addition, the test current may, for example, use a median current value of the plurality of redundant resistive memory devices as the test current for estimating the forming voltage, or use a test current average of the plurality of redundant resistive memory devices as the test current for estimating the forming voltage. Lastly, the estimated forming voltage is applied to the resistive memory devices of the main memory cell block (step S306).

In summary, the voltage value of the forming voltage applied to the main memory cell block may be estimated by performing the forming procedure on the redundant memory cell block according to the embodiments of the disclosure. In this way, the formation of the conductive wire may be optimized to improve high temperature data retention of the memory storage apparatus and reliability of the memory storage apparatus. Moreover, since the redundant memory cell block will be included in general memory array, the problem of increased circuit area is avoided. In addition, by using the forming procedure for the conductive filament in the foregoing embodiments, the forming voltage used to form the conductive filament may be optimized for each die. As a result, problems regarding defects on the conductive filament caused by die-to-die variation or wafer-to-wafer variation may be solved.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory storage apparatus, comprising:
   a memory cell array, comprising:
      a main memory cell block, comprising a plurality of resistive memory devices arranged in an array; and
      a redundant memory cell block, comprising a plurality of redundant resistive memory devices arranged in an array; and
   a memory control circuit, coupled to the memory cell array, applying a test forming voltage to at least one redundant resistive memory device, reading a corresponding test current, and determining a forming voltage applied to the main memory cell block according to the test forming voltage, the test current, a forming current-voltage characteristic data and a target forming current.

2. The memory storage apparatus according to claim 1, wherein the memory control circuit comprises:
   a forming control circuit;
   a forming voltage generator, coupled to the forming control circuit and the memory array, and controlled by the forming control circuit to generate the test forming voltage and the forming voltage; and a forming current sense circuit, coupled to the forming control circuit and the memory array, and reading the test current to generate a test current signal to the forming control circuit, wherein the forming control circuit determines the forming voltage according to the test forming voltage, the test current signal, the forming current-voltage characteristic data and the target forming current, and controls the forming voltage generator to apply the forming voltage to the main memory cell block.

3. The memory storage apparatus according to claim 1 wherein the forming current-voltage characteristic data comprises a forming current-voltage characteristic curve or a forming current-voltage characteristic look-up table, and the forming current-voltage characteristic look-up table indicates the forming voltage corresponding to the test forming voltage and the test current signal for reaching the target forming current.

4. The memory storage apparatus according to claim 3, wherein the forming current-voltage characteristic curve is a straight line having a preset slope.

5. The memory storage apparatus according to claim 2, wherein the forming current-voltage characteristic data comprises a forming current-voltage characteristic curve or a forming current-voltage characteristic look-up table, and the forming current-voltage characteristic look-up table indicates the forming voltage corresponding to the test forming voltage and the test current signal for reaching the target forming current.

6. The memory storage apparatus according to claim 5, wherein the forming current-voltage characteristic curve is a straight line having a preset slope.

7. The memory storage apparatus according to claim 1, wherein the test forming voltage comprises a gate voltage and a drain voltage.

8. The memory storage apparatus according to claim 1, wherein the memory control circuit further determines the forming voltage applied to the main memory cell block according to a median current value of the test current corresponding to the at least one redundant resistive memory device.

9. A forming method of a resistive memory device of a memory storage apparatus, the memory storage apparatus comprising a memory array, the memory cell array comprising a main memory cell block and a redundant memory cell block, the forming method of the resistive memory device comprising:

applying a test forming voltage to at least one redundant resistive memory device and reading a corresponding test current;

determining a forming voltage applied to the main memory cell block according to the test forming voltage, the test current, a forming current-voltage characteristic data and a target forming current; and applying the forming voltage to the main memory cell block.

10. The memory storage apparatus according to claim 9, wherein the forming current-voltage characteristic data comprises a forming current-voltage characteristic curve or a forming current-voltage characteristic look-up table, and the forming current-voltage characteristic look-up table indicates the forming voltage corresponding to the test forming voltage and the test current signal for reaching the target forming current.

11. The forming method of the resistive memory device according to claim 10, wherein the forming current-voltage characteristic curve is a straight line having a preset slope.

12. The forming method of the resistive memory device according to claim 9, wherein the test forming voltage comprises a gate voltage and a drain voltage.

13. The forming method of the resistive memory device according to claim 9, further comprising:

determining the forming voltage applied to the main memory cell block according to a median current value of the test current corresponding to the at least one redundant resistive memory device.

* * * * *